US005636283A

United States Patent [19]

Hill et al.

[11] Patent Number: 5,636,283

[45] Date of Patent: Jun. 3, 1997

[54] PROCESSING AUDIO SIGNALS

[75] Inventors: Philip N. C. Hill, Berkshire; Matthew J. Willis, Oxfordshire, both of England

[73] Assignee: Solid State Logic Limited, Oxford, England

[21] Appl. No.: 228,353

[22] Filed: Apr. 15, 1994

[30] Foreign Application Priority Data

Apr. 16, 1993 [GB] United Kingdom .................... 9307934

[51] Int. Cl.[6] ................................ H04R 5/00; H03G 3/00

[52] U.S. Cl. .................................. 381/17; 381/1; 381/63; 84/630; 84/DIG. 26

[58] Field of Search .................................... 381/17, 18, 1, 381/61, 63, 119; 181/143; 84/622, 625, DIG. 26, 630, 707; 360/13, 32, 14.1, 14.2, 14.3

[56] References Cited

U.S. PATENT DOCUMENTS

| | | | |
|---|---|---|---|
| 4,792,974 | 12/1988 | Chace | 381/17 |
| 4,868,687 | 9/1989 | Penn et al. | 360/13 |
| 5,023,913 | 6/1991 | Matsumoto et al. | 381/1 |
| 5,027,687 | 7/1991 | Iwamatsu | 84/622 |
| 5,027,689 | 7/1991 | Fujimori | 84/622 |
| 5,212,733 | 5/1993 | DeVitt et al. | 381/119 |
| 5,265,516 | 11/1993 | Usa et al. | 84/622 |
| 5,291,556 | 3/1994 | Gale | 381/17 |
| 5,337,363 | 8/1994 | Platt | 381/17 |
| 5,361,333 | 11/1994 | Ahlquist et al. | 395/142 |
| 5,386,082 | 1/1995 | Higashi | 381/17 |
| 5,524,060 | 1/1996 | Silfvast et al. | 381/106 |

FOREIGN PATENT DOCUMENTS

| | | |
|---|---|---|
| 0516183 A1 | 12/1992 | European Pat. Off. . |
| 2277239 | 10/1994 | United Kingdom . |
| WO88/02958 | 4/1988 | WIPO . |
| WO91/13497 | 9/1991 | WIPO . |

*Primary Examiner*—Curtis Kuntz
*Assistant Examiner*—Xu Mei
*Attorney, Agent, or Firm*—Nixon & Vanderhye P.C.

[57] ABSTRACT

A system for mixing five channel sound which surrounds an audio plane. The position of a sound source is displayed on a VDU (16) relative to the position of a notional listener (31). The sound source is moved within the audio plane by operation of a stylus (23) upon a touch tablet (24). Thus, an operator is only required to specify positions of a sound source over time, whereafter a processing unit (17) calculates actual gain values for the five channels at sample rate. Gain values are calculated for the sound track for each of the loudspeaker channels and for each of these specified points. Gain values are then produced at sample rate by interpolating calculated gain values for each channel at sample rate.

22 Claims, 7 Drawing Sheets

PROCESSING AUDIO SIGNALS

FIELD OF THE INVENTION

The present invention relates to a method and to an apparatus for creating the effect of a sound source moving in space.

BACKGROUND OF THE INVENTION

The production of cinematographic films with stereo sound tracks has been known for some time and, more recently, stereo sound tracks have been produced for video recordings. In order to enhance the effect of sounds emanating from different directions, the stereo principle has been extended by the provision of six separate audio channels, consisting of a front left, front right, front centre, rear left, rear right and a low frequency channel, often referred to as a boom channel. Thus, with such an arrangement, it is possible to position a sound anywhere within a two-dimensional plane, such that the sound sources appear to surround the audience.

The position of a sound source in the six channel system is determined by the contribution made by signals derived from a recorded track for that respective source, to each of the five spatially displaced channels. The allocation of a contribution to these channels is determined during the mixing process, in which many input tracks are combined and distributed, in varying amounts, to said five output channels. Conventionally, the mixing of these channels has been done under the manual control of an operator, in response to the adjustment of manual sliders or manual joysticks etc. Thus, in known systems, an operator is able to control the contribution of the originating sound to each of the channels. Or, considered from the view point of the originating sound source, an operator is in a position to control the gain of each of the five channels independently, thereby enabling said operator to simulate the positioning of the sound source within the sound-plane of the auditorium.

A problem with known systems, which are capable of operating in a professional environment, is that a significant amount of skill is required on the part of an operator, in order to position a sound correctly within the listening plane. Although an operator has complete control as to the extent to which gain is controlled for each of the channels, he has very little guidance as to how this control should actually be exercised. Furthermore, this problem becomes particularly acute if a modification is required so as to reposition a sound source, in that it may not be at all apparent to an operator as to what modifications to the gains are required to effect the re-positioning of the sound source as required.

Computerised systems have been proposed which allow the position of a sound source to be defined via a graphical user interface. However, a problem with procedural software approaches is that the processing requirements are substantial if a plurality of channels, each conveying digitally encoded audio information, are to be manipulated simultaneously.

It is an object of the present invention to provide an improved method and apparatus for simulating the position of the sound in space.

SUMMARY OF THE INVENTION

According to a first aspect of the present invention, there is provided a method of creating the effect of a sound source moving in space, by supplying sound signals to a plurality of fixed loudspeakers, comprising recording sound signals onto a replayable track in digitised form, wherein said sound signals are recorded as digital samples and are replayed by being supplied to a digital to analog convertor at an appropriate sample rate; defining the movements of the sound source with respect to the specified points, each of which defines the position of the sound at a specified time; calculating gain values for the sound track for each of said loudspeaker channels for each of said specified points; and interpolating calculated gain values to produce gain values for each loudspeaker channel at said sample rate.

In a preferred embodiment, a sound plane is defined by five loudspeakers, each arranged to receive a respective sound channel. Preferably, each sound channel receives contributions from a plurality of recorded tracks.

According to a second aspect of the present invention, there is provided apparatus for creating the effect of a sound source moving in space, including means for supplying sound signals to a plurality of fixed loudspeakers, comprising recording means for recording said sound onto a replayable track in digitised form, wherein sound signals are recorded as digital samples which are supplied to a digital to analog convertor at an appropriate sample rate; means for defining the movement of the sound source with respect to specified points, each of which defines the position of the sound at a specific time; calculating means for calculating gain values for the sound track for each of said loudspeaker channels for each of said specified points; and interpolating means for interpolating calculated gain values to produce gain values for each loud speaker channel at said sample rate.

DETAILED DESCRIPTION OF A PREFERRED EMBODIMENT

Figure 1:
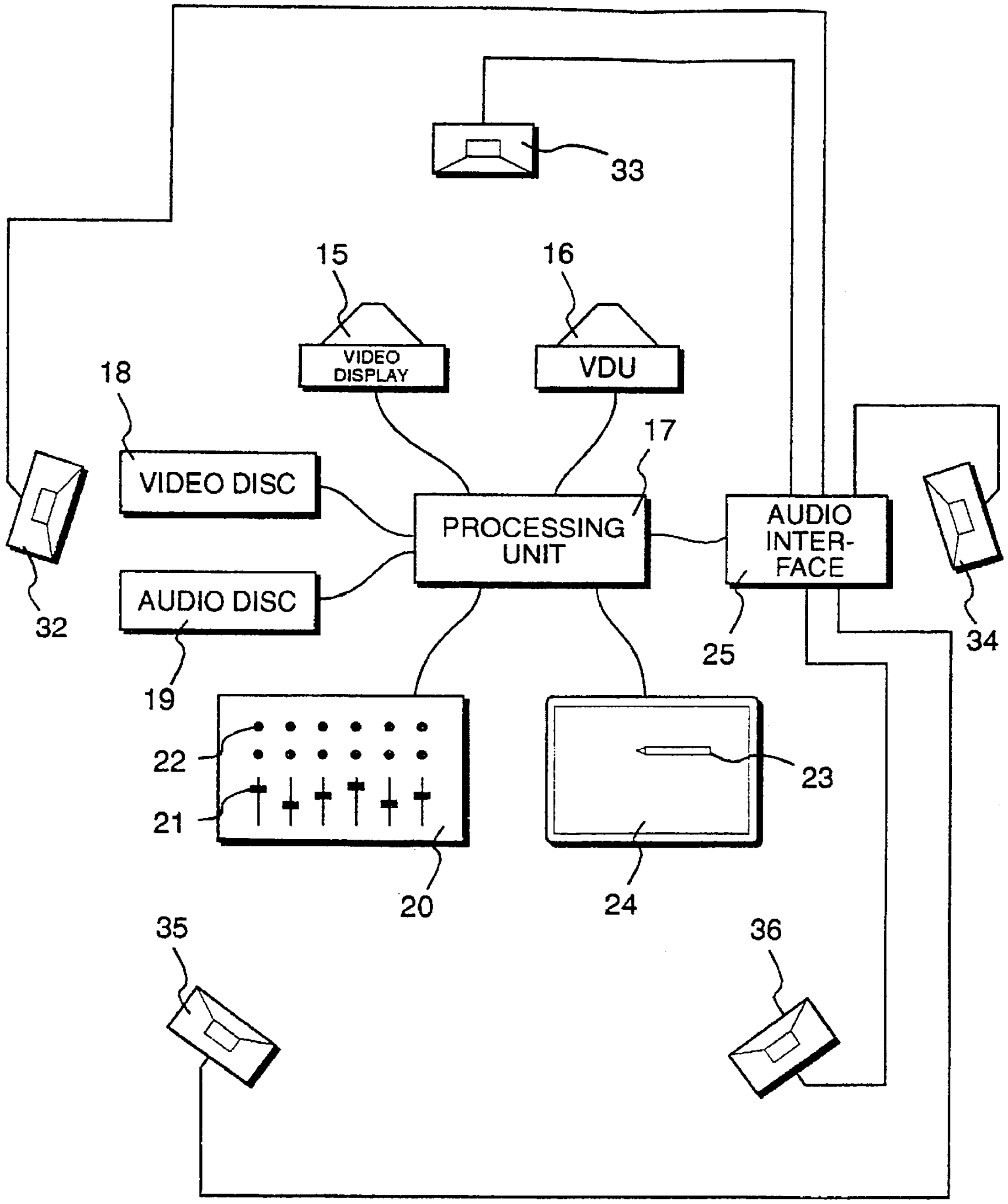
FIG. 1 shows a system for mixing audio signals, including an audio mixing display input device and a processing unit.

A system for processing, editing and mixing audio signals to combine them with video signals, is shown in FIG. 1. Video images are displayable on a video monitor display 15, similar to a television monitor. In addition to showing video clips, the video display 15 is also arranged to overlay video related information over the video image itself. A computer type visual display unit 16 is arranged to display information relating to audio signals. Both displays 15 and 16 receive signals from a processing unit 17 which in turn receives compressed video data from a magnetic disk drive 18 and full bandwidth audio signals from an audio disk drive 19.

The audio signals are recorded in accordance with professional broadcast standards at a sampling rate of 48 kHz.

Gain control is performed in the digital domain on a sample-by-sample basis in real time, at full sample rate.

Manual control is effected via a control panel 20, having manually operable sliders 21 and tone control knobs 22. In addition, input information is also provided by the manual operation of a stylus 23 upon a touch tablet 24.

Video data is stored on the video storage disk drive 18 in compressed form. Said data is de-compressed in real-time for display on the video display monitor 15 at full video rate. Techniques for compressing the video signals and decompressing said signals are disclosed in the Applicants co-pending International Patent application PCT/GB93/00634, published as WO 93/19467 and before the U.S. Patent Office as 08/142,461, the full contents of which is hereby incorporated by reference to form part of the present disclosure.

The system shown in FIG. 1 is arranged to provide audio mixing, synchronised to timecode. Thus, original images may be recorded on film or on full bandwidth video, with timecode. These video images are converted to a compressed video format, to facilitate the editing of audio signals, while retaining an equivalent timecode. The audio signals are synchronised to the timecode during the audio editing procedure, thereby allowing the newly mixed audio to be combined with the original film or full-bandwidth video.

The audio channels are mixed such that a total of six output channels are generated, each stored in digital form on the audio storage disk drive 19. In accordance with convention, the six channels represent a front left channel, a front central channel, a front right channel, a rear left channel, a rear right channel and a boom channel. The boom channel stores low frequency components which, in the auditorium or cinema, are felt as much as they are heard. Thus, the boom channel is not directional and sound sources having direction are defined by the other five full-bandwidth channels.

In addition to controlling the originating sources which are combined in the final mix, the apparatus shown in FIG. 1 is also arranged to control the position and movement of sound sources within the sound plane. In this mode of operation, the audio mixing display 16 is arranged to generate a display similar to that shown in FIG. 2.

Figure 2:
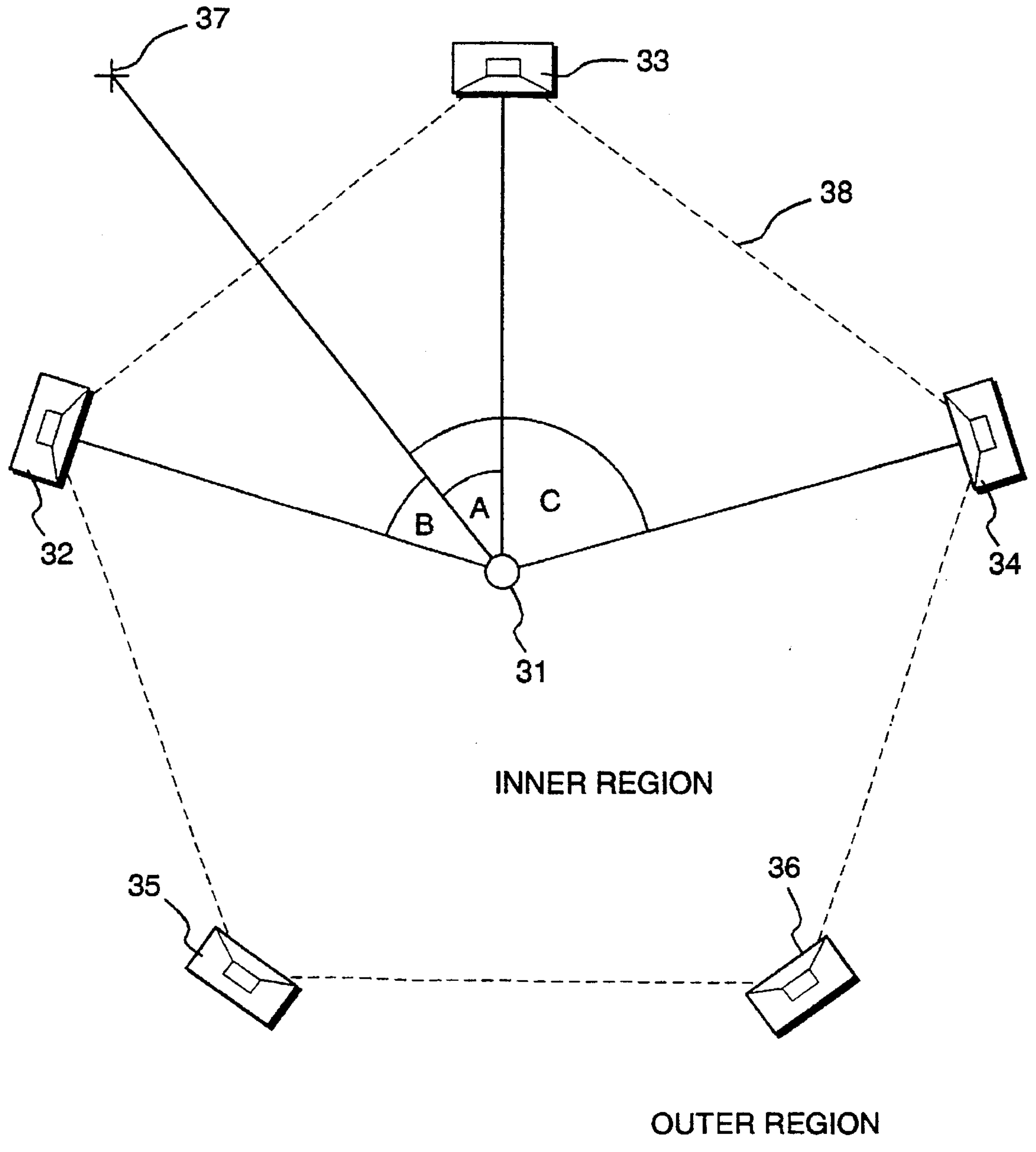
FIG. 2 schematically represents the position of loudspeakers in an auditorium and illustrates the way in which contributions are calculated for the loudspeaker channels.
Figure 3:
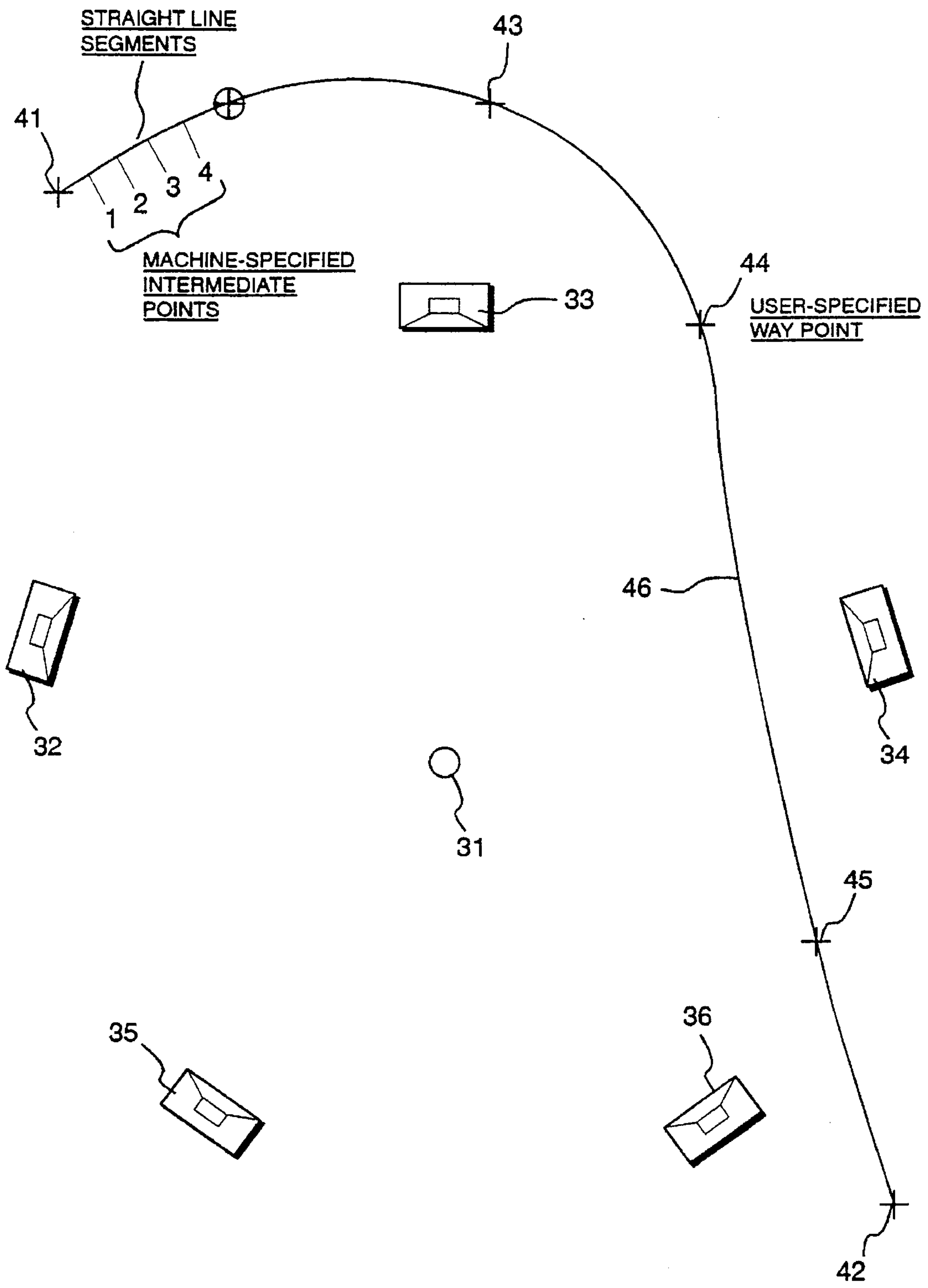
FIG. 3 illustrates an image displayed on the display unit shown in FIG. 1, in which the path of a sound source over time is illustrated.

The processing unit 17 is arranged to generate video signals for the VDU 16. These signals represent images relating to audio data and an image of this type is illustrated in FIG. 2. The image represents the position of a notional viewer 31, along with the position of five loudspeakers within an auditorium which create the audio plane. The set of speakers include a front left speaker 32 and front central speaker 33, a front right speaker 34, a rear left speaker 35 and a rear right speaker 36. The display shows the loudspeakers arranged in a regular pentagon, facilitating the use of a similar algorithm for calculating contributions to each of the channels. In order to faithfully reproduce the audio script, loudspeakers would be arranged in a similar pattern in an auditorium.

The audio VDU 16 also displays menus, from which particular operations may be selected. Selection is made by manual operation of the stylus 23 upon the touch tablet 24. Movement of the stylus 23, which in proximity to the touch tablet 24, results in the generation of a cross-shaped cursor upon the VDU 16. Thus, as the stylus 23 is moved over the touch tablet, in a similar manner to moving a pen over paper, the cross, illustrated at 37 in FIG. 2, moves over the video frame displayed by monitor 16.

Menu selection from the VDU 16 is made by placing the cross over a menu box and thereafter placing the stylus under pressure. The fact that a particular menu item has been selected is identified to the operator via a change of color of that item. Thus, from the menu, an operation may be selected in order to position a sound source. Thereafter, as the stylus is moved over the touch tablet 24, the cross 37 represents the position of a selected sound source. Once the desired position has been located, the stylus is placed under pressure and a marker thereafter remains at the selected position. Thus, operation of the stylus in this way programs the apparatus to the effect that, at a specified point in time, relative to the video clip, a particular audio source is to be positioned at the specified point: the time being specified by operation of a keyboard.

To operate the present system, an operator firstly selects the portion of the video for which sound is to be mixed. All input sound data is written to the audio disk storage device 19, at full audio bandwidth, effectively providing random accessibility to an operator. Thus, after selecting a particular video clip, the operator may select the audio signal to be added to the video.

After selecting the audio signal, a slider 21 is used to control the overall loudness of the audio signal. In addition, modifications to the tone of the signal may also be made using the tone controls 22.

By operating the stylus 23 upon the touch tablet 24, a menu selection is made to position the selected sound within the audio plane. Thus, after making this selection, the VDU 16 displays an image similar to that shown in FIG. 2, allowing the operator to position the sound source within the audio plane. In this example, the sound source is placed at position 37.

On placing the stylus 23 under pressure at position 37, the processing unit 17 is instructed to store that particular position in the audio plane, with reference to the selected sound source and the duration of the selected video clip; whereafter gain values are generated when the video clip is displayed. As previously stated, audio tracks are stored as digital samples and the manipulation of the audio data is effected within the digital domain. Consequently, in order to ensure that gain variations are made without introducing undesirable noise, it is necessary to control gain the each output channel, at sample-rate definition. In addition, this control must also be effected for each originating track of audio information which, in the present embodiment, consists of thirty eight. Thus, digital gain control signals must be generated at 48 Khz for each of thirty eight originating tracks and for each of the five output channels.

In order to produce gain values at the required rate, movement of each sound source, derived from a respective track, is defined with respect to specified points, each of which defines the position of the sound at a specified time. Some of these specified points are manually defined by a user and are referred to as "way" points. In addition, intermediate points are also automatically calculated and arranged such that an even period of time elapses between each intermediate point. In an alternative embodiment, intermediate points may define segments such that an even distance in space is covered between each of said points.

After points defining trajectory have been specified, gain values are calculated for the sound track for each of said loudspeaker channels and for each of said specified points. Gain values are then produced at sample rate for each channel of each track by interpolating the calculated gain values, thereby providing gain values at the required sample rate.

As shown in FIG. 1, the processing unit 17 receives input signals from control devices, such as the control panel 20 and touch tablet 24 and receives stored audio data from the audio disc storage device 19. The processing unit 17 supplies digital audio signals to an audio interface 25, which in turn generates five analog audio output signals to the five respective loudspeakers 32, 33, 34, 35 and 36, positioned as shown in FIG. 2.

Figure 4:
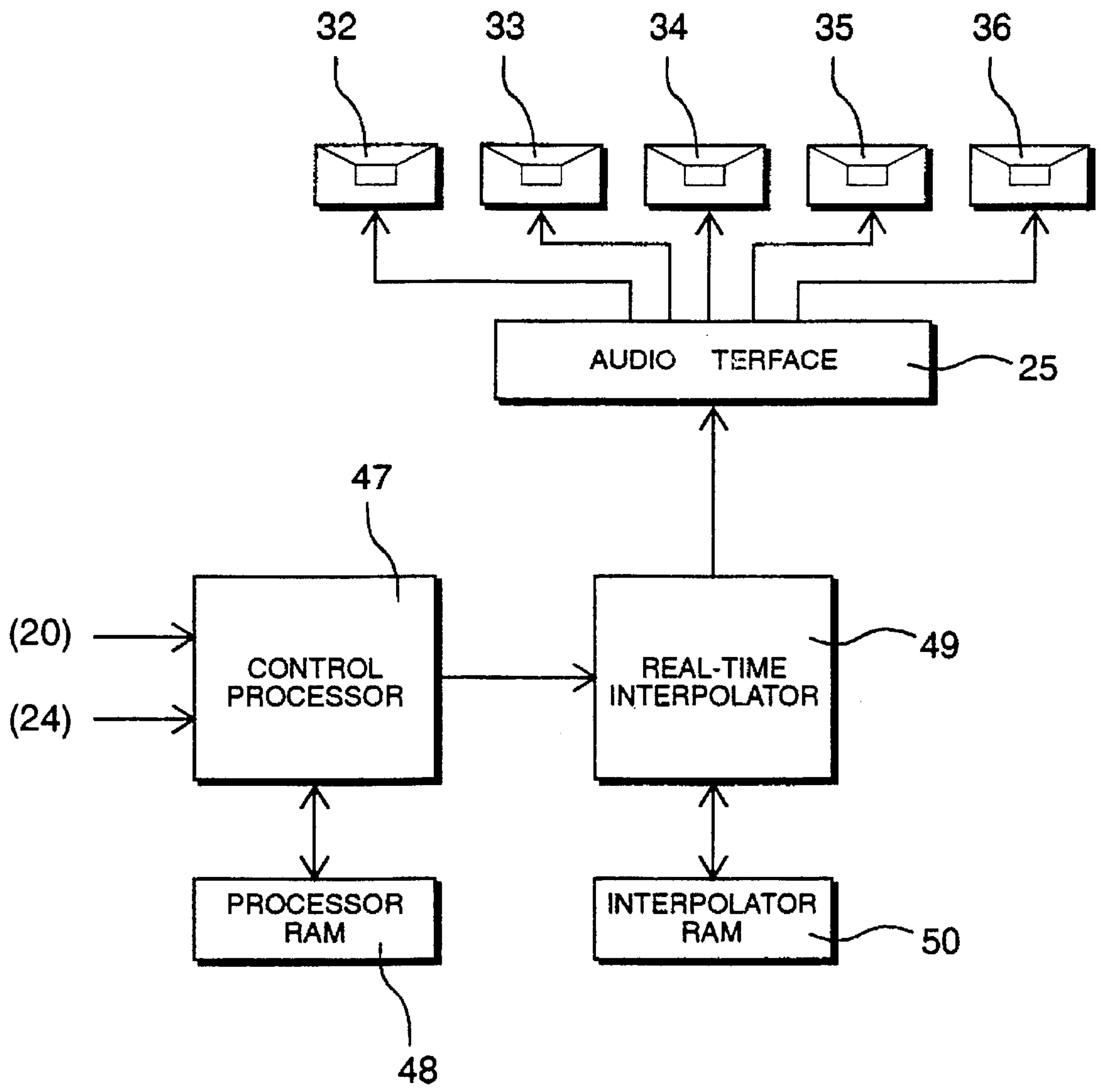
FIG. 4 details the processing unit shown in FIG. 1, including a programmable control processor and a real-time interpolator.

The processing unit 17 is detailed in FIG. 4 and includes a control processor 47, with it's associated processor random access memory (RAM) 48, a real-time interpolator 49 and its associated interpolator RAM 50. The control processor 47 is based upon a Motorola 68030 thirty two bit floating point processor or a similar device, such as a Mackintosh Quadra or an Intel 80486 processor. The control processor 47 is essentially concerned with processing non-real-time information, therefore its speed of operation is not critical to the overall performance of the system but merely affects its speed of response.

The control processor 47 oversees the overall operation of the system and the calculation of gain values is one of many sub-routines called by an overall operating program. The control processor calculates gain values associated with each specified point, consisting of user defined way points and calculated intermediate points. The trajectory of the sound source is approximately by straight lines connecting the specified points, thereby facilitating linear interpolation to be effected by the real-time interpolator 49. In alternative embodiments, other forms of interpolation may be effected, such as B-splines interpolation, however, it has been found that linear interpolation is sufficient for most practical applications, without affecting the realism of the system .

Sample points upon linearly interpolated lines have gain values which are calculated in response to the equation for a straight line, that is:

$$G=32\ mt+c.$$

Thus, during real-time operation, values for t are generated by a clock in real-time and pre-calculated values for the interpolation equation parameters (m and c) are read from storage. Thus, equation parameters are supplied to the real-time interpolator 49 from the control processor 47 and written to the interpolator's RAM 50. Such a transfer of data is effected under the control of the processor 47, which perceives RAM 50 (associated with the real-time interpolator) as part of its own addressable RAM, thereby enabling the control processor to access the interpolator RAM 50 directly. Consequently, the real-time interpolator 49 is a purpose built device having a minimal number of fast, real-time conponents.

It will be appreciated that the control processor 47 provides an interactive environment under which a user is capable of adjusting the trajectory of a sound source and modifying other parameters associated with sound sources stored within the system. Thereafter, the control processor 47 is required to effect non-real-time processing of signals in order to update the interpolator's RAM 50 for subsequent use during real-time interpolation. Thereafter, real-time interpolation is effected, thereby quickly providing feedback to an operator, such that modifications may be effected and the overall script fine-tuned so as to provide the desired result. Only at this stage, once the mixing of the audio has been finalised, would the mixed audio samples be stored, possibly be storing said mixed audio on the audio disc facility 19 or on some other storage medium, such as digital audio tape. Thereafter, the mixed audio signals are combined with the originating film or full-bandwidth video.

The control processor 47 will present a menu to an operator, allowing the operator to select a particular audio track and to adjust parameters associated with that track. Thereafter, the trajectory of a sound source is defined by the interactive modification of way points. The operation of this procedure is detailed in FIG. 5.

Figure 5:
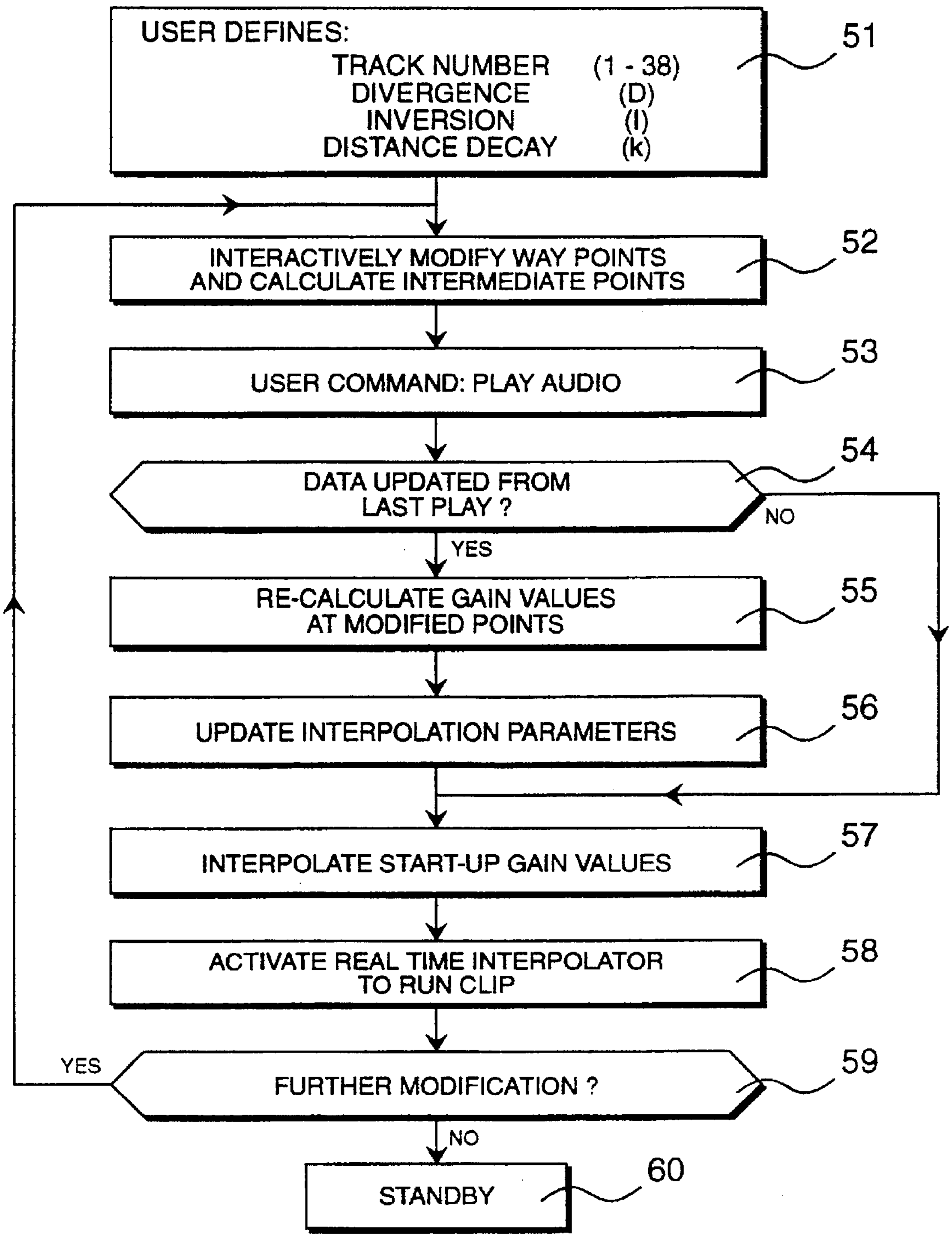
FIG. 5 details operation of the control processor shown in FIG. 4, including a procedure for calculating gain values.

At step 51 the user is invited to select a track of stored originating audio and in the preferred embodiment a total of thirty eight tracks are provided. In addition, each track has parameters associated therewith including sound divergence (D), sound inversion (I) and distance decay (K). Divergence effectively relates to the size of the audio source and therefore the spread of said source over one or more of the loudspeaker channels. As divergence increases, the contribution made to a particular channel, as the notional sound source moves away from the position of that channel, decreases. The second parameter referred to above is that of inversion which allows signals to be supplied to sources which are on the opposite side to the notional position of the sound source but displaced in phase, so as to have a cancelling effect. Thirdly, it is possible to specify the distance decay which defines the rate at which the gain decreases as the notional sound source moves away from the position of the notional listener. As shown in FIG. 5, these values are specified at step 51, whereafter, at step 52, a user is invited to interactively modify way points: in response to which the processor 47 calculates intermediate points there between. In the preferred embodiment, ten intermediate points are calculated between each pair of way points and a total of thirty way points may be specified within any one track for any one particular clip of film or video.

Generally, a user would modify one of said points and thereafter instruct the apparatus to play the audio, thereby allowing the operator to judge the result of the modification. This preferred way of operation is exploited within the machine, such that recalculation of gain data is only effected where necessary: unaffected data being retained and reused on subsequent plays.

Thus, the path of the notional sound source is specified by the interactive modification of way points. The actual positioning of intermediate points is also interactively controlled by an operator, who is provided with a "tension" parameter. The way points may be considered as fixed pins and the path connecting said points may be considered as a flexible string, the tension of which is adjustable. Thus, with a relatively high tension, the way points will be connected by what appears to be straight lines, whereas with a relatively low tension, the intermediate points will define a more curved line. Thus, the operator is provided with some control of the intermediate points, thereby increasing the rate at which a desired path may be determined, without the operator being required to generate a large number of way points.

At step 53, the user issues a command to play the audio. Before the audio is actually played, it is necessary to update any modified data. At this stage the user defined way points and the machine generated intermediate points are effectively treated equally as specified points, defining a specified position in space and a specified time at which the sound source is required to occupy that position in space. Between these specified points, gain values are calculated at sample rate by processes of linear interpolation. Thus, as far as the trajectory of the notional sound source is concerned, the specified points (made up of the user defined way points and the machine generated intermediate points) are connected by straight line segments. Furthermore, in order to effect the real-time generation of gain values at sample rate, parameters defining these lines are pre-calculated by the control processor 47 and made available to the real-time interpolator 49, via RAM 50.

It is possible that an operator, having listened to a particular effect, may wish to listen to that effect again before making further modifications. Under such circumstances, it is not necessary to effect any pre-calculation of gain values and, in response to the operator selecting the "play" mode, real-time interpolation of the stored values may be effected immediately. Thus, it can be appreciated that the control processor 47, being a shared resource, is not burned with unnecessary calculation. However, the real-time interpolater 49 is a dedicated hardware provision and no saving is made by relieving said device of calculation burden.

Thus, at step 54 a question is asked as to whether data has been updated since the last play and if this question is answered in the negative, control is directed to step 57. Alternatively, if the question at step 54 is answered in the affirmative, gain values for points which have been modified are recalculated at step 55 and the associated interpolation parameters are updated at step 54.

Thus, if the question asked at step 54 is answered in the negative, step 55 and step 56 are effectively bypassed, resulting in control being directed to step 57. At step 57, an interpolation is made between the present output value being supplied to the channels (normally zero) and the first value required as part of the effect. Thus, this interpolation procedure, effected at step 57, ensures that the effect is initiated smoothly without an initial click resulting from a fast transition to the volume levels associated with the effect.

At step 58, the clip runs with it's associated sound signals, supplied to the five channels via the real-time interpolator 49. After the clip has run, a question is asked at step 59 as to whether further modification is required and, if so, control is returned to step 52, allowing an operator to make further modifications to way points. Alternatively, if the question asked at step 59 is answered in the negative, the control processor 47 is placed in its stand-by condition, from which entries within a higher level menu may be selected, such as those facilitating the storage of data and the closing of files etc at the end of a particular job.

Figure 6:
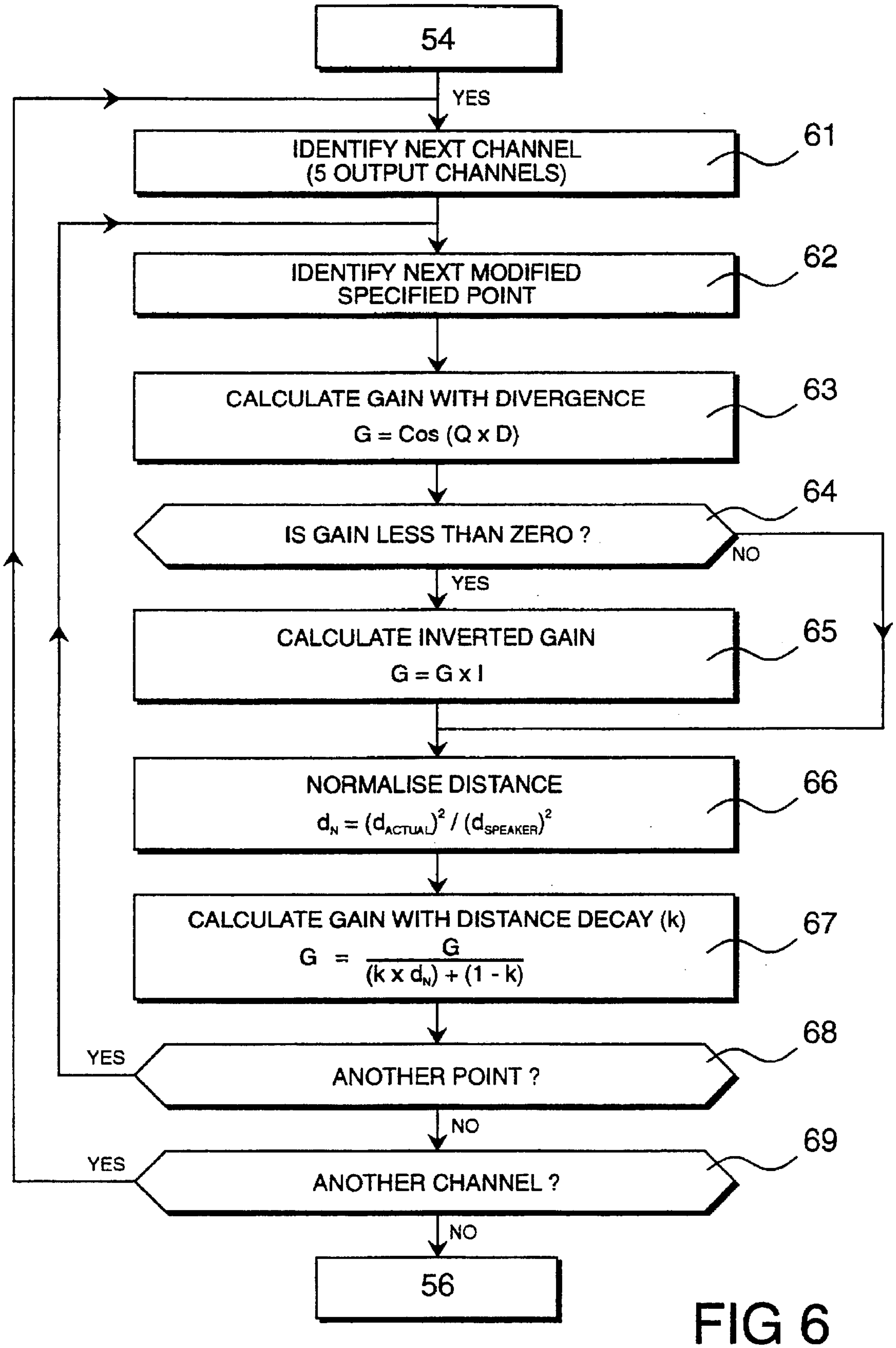
FIG. 6 details the procedure for calculating gain values identified in FIG. 5.

In addition to defining the position of way points at step 52, an operator is also provided with an opportunity to specify times associated with said points, which relate to timecode provided within the originating film or video clip. Thus, the operator is provided with an environment in which the movement of a sound source is synchronised precisely to events occurring within the visual sequence. Furthermore, given that gain values are calculated at audio sample rate, the user is provided with the ability to manipulate sounds at a definition much higher than that of single frame periods. As shown in FIG. 5, gain values are calculated at step 55 and this step is expanded in FIG. 6. Thus, in response to the question asked at step 54 being answered in the affirmative, an identification of the next channel to be processed is made at step 61, it being noted that a total of five output channels are associated with each specified point.

At step 62, the next modified specified point is identified and the calculation of gain values associated with that point is initiated at step 63.

At step 63, a provisional gain value is calculated, taking account of the divergence value specified for the particular track. Thus, the provisional gain value is derived by multiplying the angle theta of the sound source (as illustrated in FIG. 2) with the divergence value and thereafter calculating the cosine of the result.

At step 64 a question is asked as to whether the gain value calculated at step 63 is less than zero. If the gain value is less than zero, this would imply that, with a divergence D of unity, the angle theta is greater than ninety degrees. Referring to FIG. 2, such a situation would probably arise when calculating gain values for the rear speakers 35 and 36, given that the notional sound source is to the front of the notional viewer. Under these circumstances, it is possible to supply inverted sound signals to the rear speakers which, being in anti-phase to the signal supplied by the front speakers, may enhance the spatial effect.

Thus, if the question asked at step 64 is answered in the affirmative, the inverted gain is calculated at step 64, by multiplying the gain value derived at step 63 by an inversion factor I. If inversion of this type is not required, I is set equal to zero and no anti-phase contributions are generated. Similarly, if the question asked at step 64 is answered in the negative, step 65 is bypassed and control is directed to step 66.

The position of the sound source may be adjusted, such that said sound source may be positioned further away from the loudspeakers, referred to as being placed in the outer region in FIG. 2. However, the rate at which the volume of the sound diminishes as it extends further away from the position of the speakers is adjustable, in response to a distance decay parameter (K) defined by an operator.

In order to make use of the distance decay parameter (K) it is necessary to normalise distances, which is performed at step 66, such that the distance of the sound source to the notional listener is considered with reference to the distance of the loudspeaker associated with the channel under consideration. Thus, at step 66 a normalised distance parameter dN is calculated by squaring the actual distance and dividing this square by the square of the distance between the notional listener and the loudspeaker.

At step 67, the gain is calculated with reference to distance decay by taking the gain generated at step 63 or, with inversion, at step 65 and dividing this value by a denominator, derived by multiplying the distance decay parameter K by the normalised distance dN and to this value adding the value one minus K.

Thus, after step 67 the gain value has been calculated and at step 68 a question is asked as to whether another point is to be calculated for that particular channel. When answered in the affirmative, control is returned to step 62 and the next point to be processed is identified.

Eventually, all of the points will have been processed for a particular channel, resulting in the question asked at step 68 being answered in the negative. When so answered, control is directed to step 69, at which a question is asked as to whether another channel is to be processed. When answered in the affirmative, control is returned to step 61, whereupon the next channel to be processed is identified.

Eventually, all of the modified points within all of the channels will have been processed, resulting in the question asked at step 69 being answered in the negative and control being directed to step 56.

As shown in FIG. 5, interpolation parameters are updated at step 56. Gain values between specified points are calculated by linear interpolation. Thus, gain is specified at said points and adjacent points are effectively connected by a straight line. Any point along that line has a gain which may be determined by the straight line equation mt+c, where m and c are the parameters for the particular linear interpolation in question and t represents time, which is equated to a particular timecode.

The updated interpolation parameters generated at step 56 are supplied to the real-time interpolator 49 and, in particular, to the RAM 50 associated with said interpolator.

Figure 7:
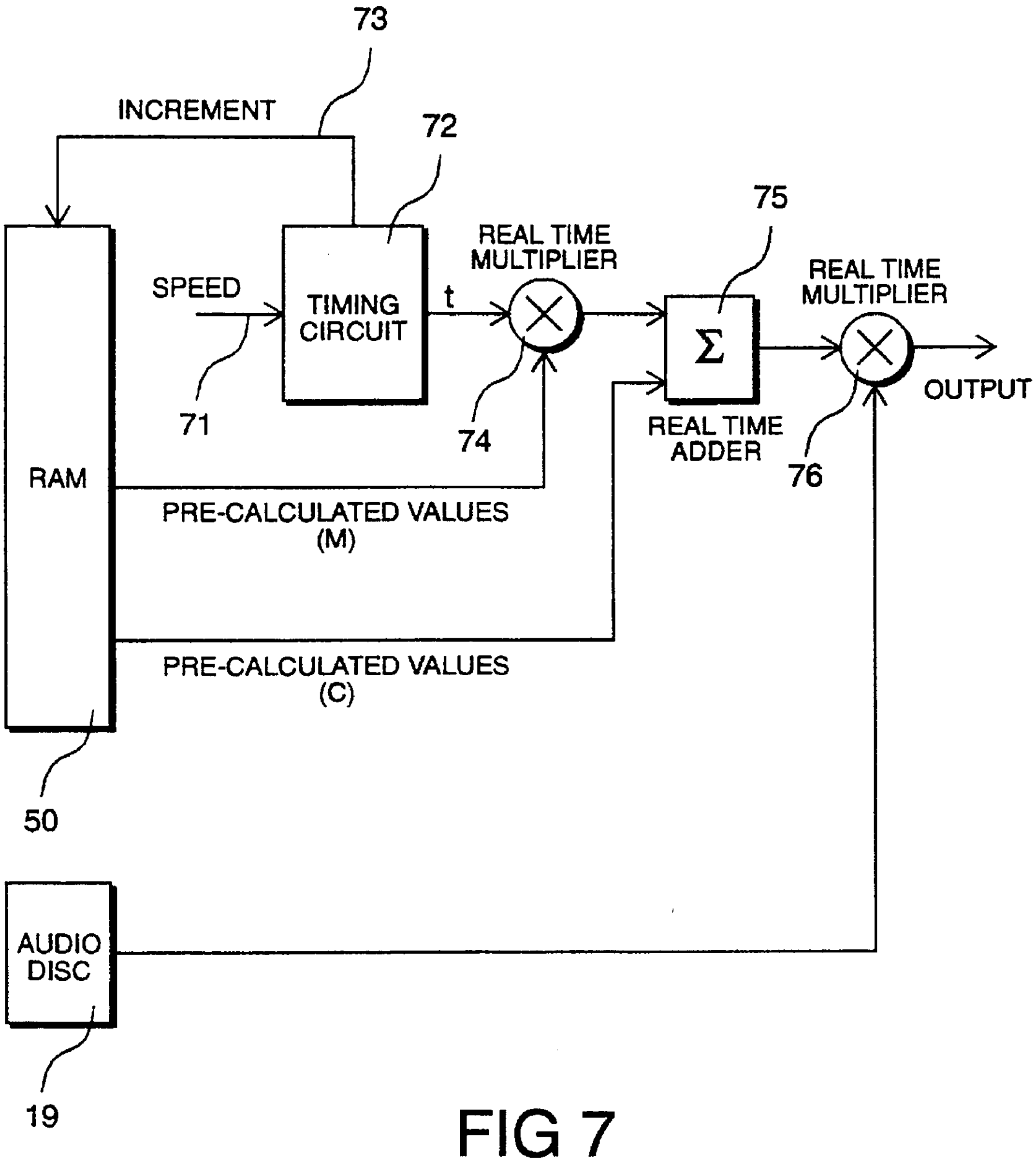
FIG. 7 details the real time interpolator identified in FIG. 4.

The real-time interpolator 49 is detailed in FIG. 7, connected to its associated interpolator RAM 50 and audio disc 19.

Step 58 of FIG. 5 activates the real-time interpolator in order to run the clip, and this is achieved by supplying a speed signal to a speed input 71 of a timing circuit 72. The timing circuit 72 achieves two things. First, it effectively supplies a parameter increment signal to RAM 50 over increment line 73. This ensures that the correct address is supplied to the RAM, for addressing the pre-calculated values for m and c. In addition, the timing circuit 72 generates values of t, from which the interpolated values are derived.

Movement of the sound source is always initiated from a specified point, therefore the first gain value is known. In order to calculate the next gain value, a pre-calculated value for m is read from the RAM 50 and supplied to a real-time multiplier 74. The real-time multiplier 74 forms the product of m and t and supplies this to a real-time adder 75. At the real-time adder 75, the output from multiplier 74 is added to the relevant pre-calculated value for c, resulting in a sum which is supplied to a second real-time multiplier 76. At the second real-time multiplier 76, the product is formed between the output real-time adder 75 and the associated audio sample, read from the audio disc 19, possibly via buffering apparatus if so required.

As previously stated, audio samples are produced at a sample rate of 48 kHz and it is necessary for the real-time interpolator 49 to generate five channels-worth of digital audio signals at this sample rate. In addition, it is necessary for the real-time interpolator 49 to effect this for all of the thirty eight recorded tracks. Thus, the devices shown in FIG. 7 are consistent with the IEEE 754 32 bit floating point protocol, capable of calculating at an effective rate of 20M FLOPS.

The ability to move objects and control both direction and velocity, facilitates the synthesizing of life-like sound effects within an auditorium or cinema. As previously stated, it is possible to define the movement of a sound source over a predetermined period of time, thereby providing information relating to the velocity of the sound source. To increase the life-like effect of the movement, the system may include processing devices for modifying the pitch of the sound as it moves towards the notional listener and away from the notional listener, thereby simulating Doppler effects. In order to faithfully reproduce this effect, it must be appreciated that the change in pitch varies with the velocity of the sound source relative to the position of the notional viewer, not its absolute speed along its own path. Thus, the processing system calculates the component of velocity in the direction directly towards or directly away from the notional listener and controls variations in pitch accordingly. In this respect, variations in pitch are achieved by effectively increasing or decreasing the speed at which the audio data is read from storage.

The true to life synthesizing nature of the system may be enhanced further to take ambient effects into account. Thus, reverb and other delay effects may be controlled in relation to the position of the sound source. Thus, reverb may be increased if the sound source is further away from the notional viewer and decreased as the sound source comes closer to the viewer. The important point to note is that any characteristic which is related to the position of the sound source may be catered for by the system, given that information relating to actual position is defined with reference to time. Once this information has been defined, it is only necessary for an operator to define the function, that is to say, the nature of the variation of the effect with respect to position, whereafter the actual generation of the effect itself is achieved automatically as the video is played.

It has been found that the most realistic effects are obtained by insuring tight synchronisation between sound and vision. The embodiment allows the position of sound sources to be controlled to sample-rate definition, thereby allowing the movement of the sound source to be accurately controlled, even within the duration of a single frame.

What we claim is:

1. A method of creating the effect of a sound source moving in space, by supplying respective sound output signals to a plurality of fixed loudspeaker channels, comprising:

recording originating sound signals onto a replayable track in digitized form wherein said sound signals are recorded as digital samples and are replayable at an appropriate sample rate;

defining movement of a sound source with respect to specified points, each of which defines the position of said sound source at a specified time;

calculating gain values for each originating sound track for each of said respective sound output signals and for each of said specified points;

interpolating calculated gain values to produce gain values for each loudspeaker channel at said sample rate; and displaying the position of said sound source, a notional listening position and the movement path of said sound source over time.

2. A method according to claim 1, wherein movement of said sound source is defined by specifying user defined way points.

3. A method according to claim 2, wherein said way points are defined by manual operation of a stylus over a touch tablet.

4. A method according to claim 2, including synchronizing each of said user defined way points to a time code.

5. A method according to claim 2, including calculating the position of intermediate specified points between said user defined way points.

6. A method according to claim 5, wherein said intermediate points are displaced by even intervals of time between user defined specified points.

7. A method according to claim 5, wherein said intermediate points are displaced by even distances of space between user defined specified points.

8. A method according to claim 1, wherein, for each specified point, calculating gain values for each loudspeaker channel with reference to the cosine of an angle between the position of a respective loudspeaker and the position of the sound source, with respect to said notional listening position.

9. A method according to claim 8, including calculating inverted gain values to produce negative phase outputs if said cosine calculation produces a negative result.

10. A method according to claim 1, wherein gain values calculated for each specified point are modified with respect to a distance decay parameter.

11. A method according to claim 1, wherein said interpolating calculated gain values comprises a linear interpolation between calculated gain values to produce sample-rate values.

12. A method according to claim 1, including calculating interpolation parameters for each interpolated segment between specified points, said interpolation parameters being stored and processed in real time to effect real time calculation of sample values.

13. A method according to claim 1, wherein the calculation of interpolation values is multiplexed so as to generate gain values for a plurality of channels.

14. A method according to claim 13, wherein interpolated gain values are generated for five channels.

15. A method according to claim 1, wherein the calculation of interpolated values is multiplexed so as to generate gain values for a plurality of recorded audio tracks.

16. Apparatus for creating the effects of a sound source moving in space, by supplying sound signals to a plurality of fixed audio output devices, comprising:

recording means for recording sound signals onto a replayable track in digitized form, including means for recording said sound signals as digital samples and means for replaying said samples and supplying said samples to a digital-to-analog conversion means at an appropriate sample rate:

a display for displaying the position of said sound source and a notional listening position;

interactive means for defining the movement of said sound source with respect to specified points, wherein each of said specified points defines the position of said sound source at a specified time;

said display displaying the movement of said sound source over time;

calculating means for calculating gain values for said sound track for each of said audio output devices for each of said specified points; and interpolating means arranged to interpolate said calculated gain values to produce gain values for each audio output device at said sample rate.

17. Apparatus according to claim 16, including means for defining said specified points as user defined way points and means for calculating additional intermediate specified points.

18. Apparatus according to claim 17, including means for linearly interpolating gain values between specified points, to produce gain values at said sample rate.

19. A method for creating the effect of a sound source moving in space, by supplying respective sound output signals to a plurality of fixed loud speaker channels, comprising steps of:

recording originating sound signals onto a replayable track in digitized form, wherein said sound signals are recorded as digital samples and subsequently replayed at a sample rate;

displaying the position of said sound source and a notional listening position;

defining movement of a sound source with respect to specified points, each of said points defining the position of said sound source at a specified time;

displaying said movement of said sound source over time;

calculating gain values for each originating sound track, for each of said respective sound output signals and for each of said specified points; and interpolating gain values to produce gain values for each loudspeaker channel at a predetermined sample rate.

20. A method of creating the effect of a sound source moving in space, by supplying respective sound output signals to a plurality of fixed loudspeaker channels, comprising:

recording originating sound signals onto a replayable track in digitized form wherein said sound signals are recorded as digital samples and are replayable at an appropriate sample rate;

defining movement of a sound source with respect to specified points, each of which defines the position of said sound source at a specified time;

calculating gain values for each originating sound track for each of said respective sound output signals and for each of said specified points, wherein for each specified point, gain values are calculated for each loudspeaker channel with reference to the cosine of an angle between the position of a respective loudspeaker and the position of the sound source, with respect to a notional listening position;

interpolating calculated gain values to produce gain values for each loudspeaker channel at said sample rate; and displaying the position of said sound source, said notional listening position and the movement path of said sound source over time.

21. A method according to claim 20, wherein inverted gain values are calculated to produce negative phase outputs if said cosine calculation produces a negative result.

22. A method of creating the effect of a sound source moving in space, by supplying respective sound output signals to a plurality of fixed loudspeaker channels, comprising:

recording originating sound signals onto a replayable track in digitized form wherein said sound signals are recorded as digital samples and are replayable at an appropriate sample rate;

defining movement of a sound source with respect to specified points, each of which defines the position of said sound source at a specified time;

calculating gain values for each originating sound track for each of said respective sound output signals and for each of said specified points;

interpolating calculated gain values to produce gain values for each loudspeaker channel at said sample rate, wherein the calculation of interpolated gain values is multiplexed so as to generate gain values for thirty-eight recorded audio tracks; and displaying the position of said sound source, a notional listening position and the movement path of said sound source over time.

* * * * *